United States Patent [19]
McClure

[11] Patent Number: 5,592,422
[45] Date of Patent: Jan. 7, 1997

[54] REDUCED PIN COUNT STRESS TEST CIRCUIT FOR INTEGRATED MEMORY DEVICES AND METHOD THEREFOR

[75] Inventor: David C. McClure, Carrollton, Tex.

[73] Assignee: SGS-Thomson Microelectronics, Inc., Carrollton, Tex.

[21] Appl. No.: 476,658

[22] Filed: Jun. 7, 1995

[51] Int. Cl.$^6$ .................................................. G11C 29/00
[52] U.S. Cl. ................ 365/201; 365/189.05; 365/230.08
[58] Field of Search ............................... 365/201, 189.05, 365/185.33, 230.08, 200

[56] References Cited

U.S. PATENT DOCUMENTS

| | | | |
|---|---|---|---|
| 4,860,260 | 8/1989 | Saito et al. | 365/201 |
| 4,951,254 | 8/1990 | Ontrop et al. | 365/201 |
| 5,315,554 | 5/1994 | Nanba | 365/201 |
| 5,339,277 | 8/1994 | McClure | 365/230.08 |
| 5,341,336 | 8/1994 | McClure | 365/201 |

*Primary Examiner*—David C. Nelms
*Assistant Examiner*—Tan T. Nguyen
*Attorney, Agent, or Firm*—Lisa K. Jorgenson

[57] ABSTRACT

A circuit and related method are provided internally to an integrated circuit for stress testing its memory. A test mode control circuit, having a first and a second test mode control input, is used, during special test operation mode, to force outputs of address buffers, data buffers and other signal buffers, like chip-enable or write buffers, to predetermined logic values so that all row and column decoders are selected and predetermined data is written into the array of memory cells. Contemporaneously are also exercised entire paths of buffers. The integrated circuit is heated and maintained at an elevated temperature for a desired time, and then cooled down. In this way it is possible, at wafer level, to stress test for ionic contamination, trap sites and weak oxides the integrated circuit in a short time, requiring only a limited number of test signals. For example by connecting only four probes to the integrated circuit (ground, supply voltage and two test mode inputs), it is possible to write all 0's or all 1's and to deselect the entire memory array during the test. This circuit allows to use very simple test equipment and reduces dramatically test times, avoiding consequent burn in of packaged devices.

34 Claims, 4 Drawing Sheets

REDUCED PIN COUNT STRESS TEST CIRCUIT FOR INTEGRATED MEMORY DEVICES AND METHOD THEREFOR

BACKGROUND OF THE INVENTION

1. Field of the Invention

The present invention relates to the testing of memory devices and more particularly to the testing of static random access memory (SRAM) devices, first-in first-out (FIFO) memory devices, and other memories incorporated in integrated circuits.

2. Description of the Prior Art

The premature or infant failure of memory cells in integrated SRAMs, multiple port memories, FIFO memories and other memory products has been an unfortunate but all too common occurrence. Moreover, failure of such parts in the field is unacceptable to vendors of products incorporating integrated circuit memory. As a result, nondestructive testing of all integrated circuits to expose and detect that integrated circuits subject to infant failure is dictated by the market.

One contemporary testing regimen is to place memory devices into burn in oven, elevating the device temperature, and then exercising this devices by varying applied voltages to the product. For some large capacity memory devices the period in the burn in oven has reached 96 hours, in order to stress each of over one thousand wordlines and millions of memory cells. Such long burn-in cycles pose an obvious bottleneck to production, and are useless for generating up to the minute information about possible faults in the manufacturing process. An accelerated stress mode that eliminates this bottleneck without damaging good memory product would have apparent benefits.

For some test or operating modes of the memory array, selection of all or a portion of row and/or bit lines at a single time is desirable. An example of a test mode where selecting all or a portion of the row and bit lines at a single time is used is described in co-pending U.S. patent application Ser. No. 07/954,276, entitled Stress Test For Memory Arrays In Integrated Circuits, filed Sep. 30, 1992, assigned to SGS THOMSON Microelectronics, Inc. and incorporated herein by this reference. A plurality of rows is selected at one time and a stress voltage is placed on a plurality of bit and complementary bit lines. In this manner the memory cells within the memory array are stress tested in order to detect latent defects.

Another example of test mode where selecting all the row and bit lines at a single time is used is described in U.S. Pat. No. 5,341,336 entitled Method For Stress Testing Decoders And Periphery Circuits, assigned to SGS THOMSON Microelectronics, Inc. and incorporated herein by this reference. A plurality of rows and bit lines are selected or deselected simultaneously and a stress voltage is applied to the integrated circuit. In this manner latent defects within decoders and periphery circuits can be detected.

A circuit that allows for the simultaneous selection or deselection of a plurality of rows and columns within a memory array is described in U.S. Pat. No. 5,339,277 entitled Address Buffer, assigned to SGS THOMSON Microelectronics, Inc. and incorporated herein by this reference. A first and a second circuit generate a true and a complementary signal, respectively, during normal operations of the integrated circuit. When desired the first and second circuits may be used to generate two signals of the same voltage level. The two signals of the same voltage level may then be used by an address decoder to simultaneously select or deselect a plurality of rows and/or columns within a memory array.

The increasing complexity of the memory devices is also increasing the number of signal lines that must be controlled during the test and consequently the complexity and the cost of test equipment.

Therefore, it would be desirable to provide a circuit and a method for stress testing integrated memory circuits at wafer level that permits to minimize the number of signals used to control the integrated circuit during the test and also avoids consequent burn in oven of packaged devices, resulting in an important decrease of the test time and of the complexity of test probes and test equipment.

SUMMARY OF THE INVENTION

A circuit and related method are provided internally to an integrated circuit for stress testing its memory. A test mode control circuit, having a first and a second test mode control input, is used, during special test operation mode, to force outputs of address buffers, data buffers and other signal buffers, like chip-enable or write buffers, to predetermined logic values so that all row and column decoders are selected and predetermined data is written into the array of memory cells. Contemporaneously are also exercised entire paths of buffers. The integrated circuit is heated and maintained at an elevated temperature for a desired time, and then cooled down. In this way it is possible, at wafer level, to stress test for ionic contamination, trap sites and weak oxides the integrated circuit in a short time, requiring only a limited number of test signals. For example by connecting only four probes to the integrated circuit (ground, supply voltage and two test mode inputs), it is possible to write all 0's or all 1's and to deselect the entire memory array during the test. This circuit allows to use very simple test equipment and reduces dramatically test times, avoiding consequent burn in of packaged devices.

DETAILED DESCRIPTION OF THE PREFERRED EMBODIMENT

Figure 1:
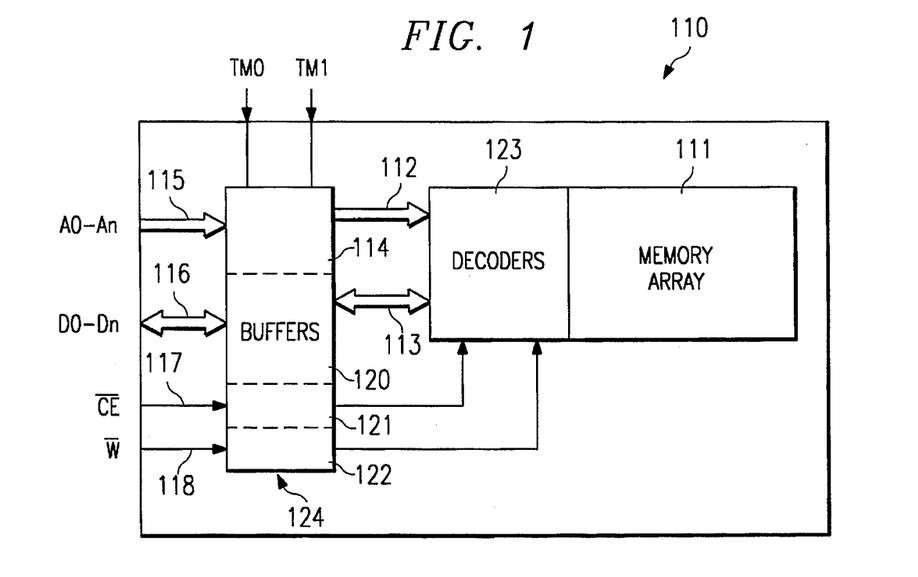
FIG. 1 is a schematic diagram of an integrated memory device, in accordance with this invention.

FIG. 1 illustrates an example of an integrated memory circuit 110 with which a preferred embodiment of the invention is implemented. Integrated memory circuit 110 is a static random access memory (SRAM), having its memory cells in memory array 111. Memory cells in memory array 111 are arranged in rows and columns, not shown in figure. It should be noted that the designation of rows and columns in memory 110 use the term row to refer to the array direction in which a plurality of memory cells is selected by way of a wordline. The term column is used in this description to refer to the array direction in which one or more of the memory cells in the selected row are selected for read or write access. It is contemplated that such use of the terms rows and columns is consistent with the general understanding in the art.

Memory cells are selected by row and column decoders 123. These decoders are controlled by an internal address bus 112 exiting from address buffer 114. The address buffer 114 receives on its input the external address bus 115 on which are present the address signals A0–An. Data buffer 120 is used to transfer data to and from the memory array through the two-way data busses 113 and 116, during read and write cycles. Two logic signals, chip-enable (CE bar) and write enable (W bar), pass respectively through the buffers 121 and 122. All these buffers 114, 120, 121 and 122, indicated globally by the reference 124 in the figure, are controlled by two external signals, TM0 and TM1. From these two signals it is possible, during testing of the integrated circuit, to enter special test operation modes and to force the outputs of buffers 114 to predetermined logic values. By applying different logic signals to the input terminals TM0 and TM1 it is possible, for example, to select all row and column decoders, and to contemporaneously write predetermined data into the whole array of memory cells. It is also possible, through the same inputs, to deselect all row and column decoders.

Figure 2:
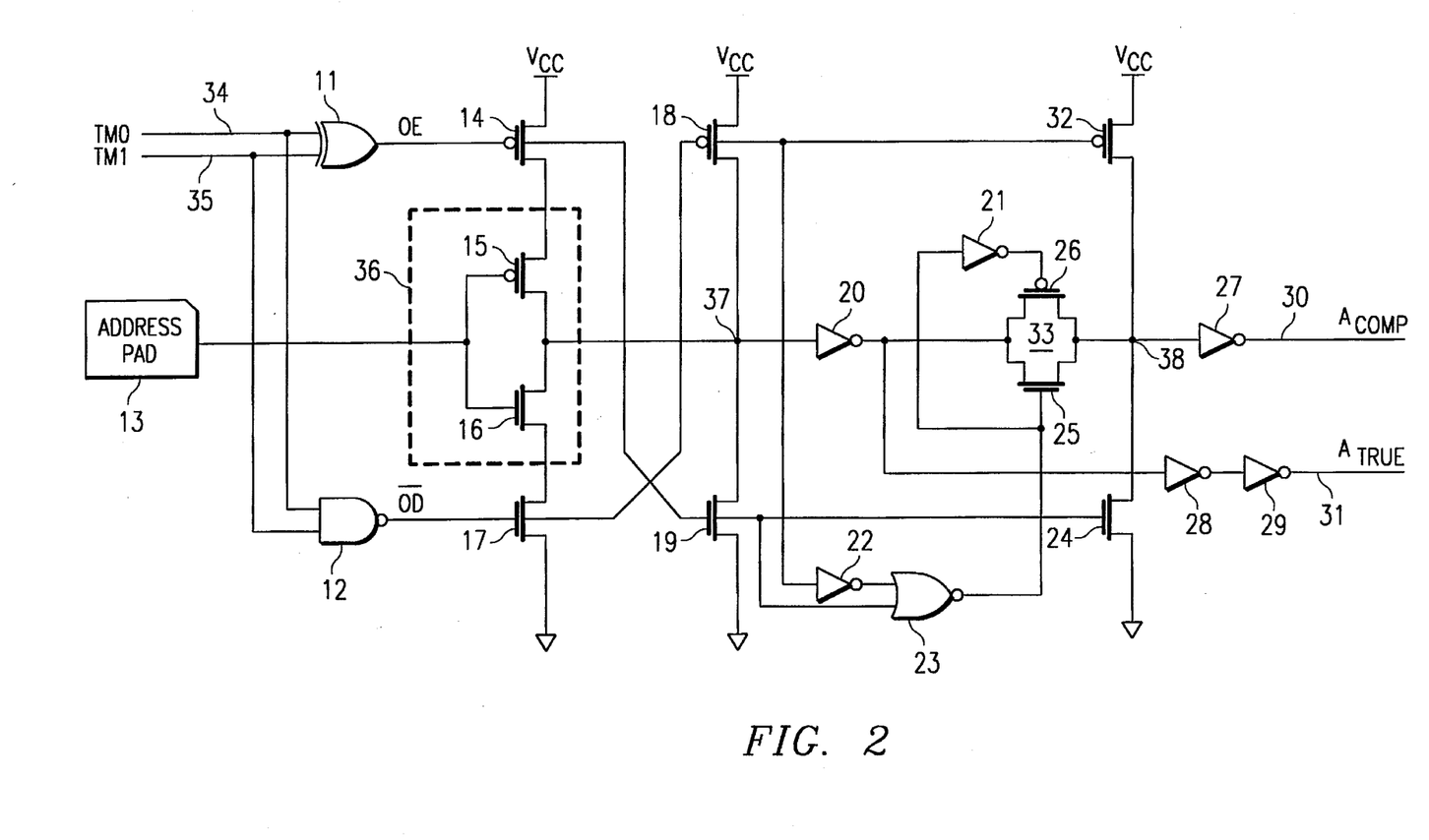
FIG. 2 is an electrical diagram, in schematic form, of an address buffer according to the preferred embodiment of the invention.

FIG. 2 is an electrical diagram illustrating a circuit 10 for an address buffer 114 according to the present invention. First inverter 36 is composed of an n-channel transistor 16 and a p-channel transistor 15 that receives address pad 13 at their gates. Second inverter 20, third inverter 28 and fourth inverter 29 are connected in series between the output of first inverter 36 and a first output signal line 31, labeled $A_{TRUE}$. The source terminal of transistor 15 is connected to a pull-up p-channel transistor 14 which is driven by a signal, labeled OE, exiting from the output of an EXOR gate 11. The source terminal of transistor 16 is connected to a pull-down n-channel transistor 17 which is driven by a signal, labeled OD bar, exiting from the output of a NAND gate 12. The two inputs of the EXOR gate 11, connected together with the two inputs of the NAND gate 12, receive two test mode input signals TM0 and TM1 on the input lines 34 and 35. The Node 37, common to the output of the first inverter 36 and to the input of second inverter 20, is connected to a pull-up p-channel transistor 18, driven by the signal OD bar, and to a pull-down n-channel transistor 19, driven by the signal OE.

Pass gate 33 is connected to the output of the second inverter 20. Fifth inverter 27 is connected between the output of pass gate 33 and second output signal line 30, labeled $A_{COMP}$. In the preferred embodiment, $A_{TRUE}$ and $A_{COMP}$ are input into an address decoder (not shown).

As known in the art, pass gate 33 is composed of an n-channel transistor 25 and a p-channel transistor 26 with a common source and drain. The signal used to control pass gate 33 comes from the output of a NOR gate 23. The signal OD bar is applied to a first input of the NOR gate 23, while the signal OE is applied, by means of a sixth inverting gate 22, to a second input of the NOR gate 23. The output terminal of the NOR gate 23 is connected directly to the gate of the n-channel transistor 25 and, by means of a seventh inverting gate 21, to the gate of the p-channel transistor 26.

The node 38, common to the output of the pass gate 33 and to the input of the fifth inverter 27, is connected to a pull-up p-channel transistor 32, driven by the signal OD bar, and to a pull-down n-channel transistor 24, driven by the signal OE.

The following table shows the possible status of the mode control input signals TM0 and TM1, and the corresponding operation modes:

| TM0 | TM1 | Status |
|---|---|---|
| 0 | 0 | Normal |
| 0 | 1 | Test (Write all 0's) |
| 1 | 0 | Test (Write all 1's) |
| 1 | 1 | Test (deselect all array) |

The logic state received by the mode control input signals, TM0 and TM1, is the mode select code. As can be seen, during the normal operation mode the TM0 and TM1 signals must be maintained low. If at least one of these two signals is high the integrated circuit enters the special test mode operation. There are three different test modes. If TM0 is low and TM1 is high all row and column decoders are selected and the entire array of cells is written with 0's, if TM0 is high and TM1 is low all row and column decoders are selected and the entire array of cells is written with 1's, and finally, if both TM0 and TM1 are high all row and column decoders are deselected.

As an example of normal operation of the address buffer 10, if both the signals TM0 and TM1 are low, the output of the EXOR gate 11 (signal line labeled OE) is low, while the output of the NAND gate 12 (signal line labeled OD bar), is high. This condition causes both the pull-up transistor 14 and the pull-down transistor 17 to be on, so that the signal present on the address pad 13 is inverted by the first inverter 36 and reaches the node 37. The pull-up and pull-down transistors 18 and 19, connected to the node 37 are both off, so the signal present on node 37 is inverted by the second inverter 20 and reaches pass gate 33. The pass gate 33, driven by the gates 22 and 23, in this condition is on so that the signal present on its input can pass to its output 38. The pull-up and pull-down transistors 32 and 24, connected to the node 38 are both OFF, so the signal present on this node is inverted by the fifth inverter 27 and reaches the second output signal line 30, labeled $A_{COMP}$. The signal present on the output of the second inverter 20 reaches also, by means of a third and a fourth inverter 28 and 29, the first output signal line 31, labeled $A_{TRUE}$. Inverters 28 and 29 are used to increase drive capacity for the signal $A_{TRUE}$. In this condition of normal operation, thus, on the first output signal line 31, labeled $A_{TRUE}$, is present a signal corresponding to the input signal present on the address pad 13, while on the second output signal line 30, labeled $A_{COMP}$, is present a signal complementary to the input signal present on the address pad 13.

For a first example of a test mode operation of the address buffer 10, if the signal TM0 is low and the signal TM1 is high, the output of the EXOR gate 11 (signal line labeled OE) is high, and the output of the NAND gate 12 ( signal line labeled OD bar) is high. This condition causes the pull-up transistor 14 to be off and the pull-down transistor 17 to be on. In this condition the inverter 36 does not work as an inverter and its output is forced low by the pull-down transistor 19, which is turned on by the signal OE. The pull-up transistor 18, connected to the node 37 and driven by the signal OD bar, is off. The logic low signal present on node 37 becomes, by means of the three inverters in series 20, 28 and 29, a logic high signal on the first output signal line 31, labeled $A_{TRUE}$. In this condition, the pass gate 33, driven by the gates 22 and 23, is off and node 38 is forced low by the pull-down transistor 24 which is turned on by the signal OE. The pull-up transistor 32, connected to the node 38 and driven by the signal OD bar, is OFF. The logic low signal present on node 38 becomes, by means of the inverter 27, a logic high signal on the second output signal line 30, labeled $A_{COMP}$. Therefore, in this condition, both outputs $A_{TRUE}$ and $A_{COMP}$ of the address buffer are high. This means that if the address decoders, which have $A_{TRUE}$ and $A_{COMP}$ as inputs, are composed of NAND gates, and these NAND gates are used to select rows and columns in a memory array, then all of the NAND gates have a low voltage level on their outputs. This causes all of the rows and columns in the memory array to be selected in this first test mode.

The second test mode operation of the address buffer is selected by the signal TM0 high and the signal TM1 low. In this condition both the output of the EXOR gate 11 (signal line labeled OE), and the output of the NAND gate 12 (signal line labeled OD bar), are high. This condition causes the pull-up transistor 14 to be off and the pull-down transistor 17 to be on. The inverter 36 does not work as an inverter and its output is forced low by the pull-down transistor 19 which is turned on by the signal OE. The pull-up transistor 18, connected to the node 37 and driven by the signal OD bar is off. The logic low signal present on node 37 becomes, by means of the three inverters in series 20, 28 and 29, a logic high signal on the first output signal line 31, labeled $A_{TRUE}$. The pass gate 33, driven by the gates 22 and 23, is off and node 38 is forced low by the pull-down transistor 24 which is turned on by the signal OE. The pull-up transistor 32, connected to the node 38 and driven by the signal OD bar is off. The logic low signal present on node 38 becomes, by means of the inverter 27, a logic high signal on the second output signal line 30, labeled $A_{COMP}$. Therefore, also in this second test mode condition, both outputs $A_{TRUE}$ and $A_{COMP}$ of the address buffer are high. This means that if the address decoders, which have $A_{TRUE}$ and $A_{COMP}$ as inputs, are composed of NAND gates, and these NAND gates are used to select rows and columns in a memory array, then all of the NAND gates have a low voltage level on their outputs. This causes all of the rows and columns in the memory array to also be selected in this second test mode.

The third test mode operation of the address buffer is selected by both signals TM0 and TM1 high. In this condition the output of the EXOR gate 11 (signal line labeled OE) is low, and the output of the NAND gate 12 (signal line labeled OD bar) is low. This condition causes the pull-down transistor 17 to be off. The inverter 36 does not work as an inverter and its output is forced high by the pull-up transistor 18 which is turned on by the signal OD bar. The pull-down transistor 19, connected to the node 37 and driven by the signal OE is off. The logic high signal present on node 37 becomes, by means of the three inverters in series 20, 28 and 29, a logic low signal on the first output signal line 31, labeled $A_{TRUE}$. The pass gate 33, driven by the gates 22 and 23, is off and node 38 is forced high by the pull-up transistor 32 which is turned on by the signal OD bar. The pull-down transistor 24, connected to the node 38 and driven by the signal OE bar is off. The logic high signal present on node 38 becomes, by means of the inverter 27, a logic low signal on the second output signal line 30, labeled $A_{COMP}$. Therefore, in this third test mode condition, both outputs $A_{TRUE}$ and $A_{COMP}$ of the address buffer are low. This means that if the address decoders, which have $A_{TRUE}$ and $A_{COMP}$ as inputs, are composed of NAND gates, and these NAND gates are used to select rows and columns in a memory array, then all of the NAND gates have a high voltage level on their outputs. This causes all of the rows and columns in the memory array to be deselected in this third test mode.

Figure 3:
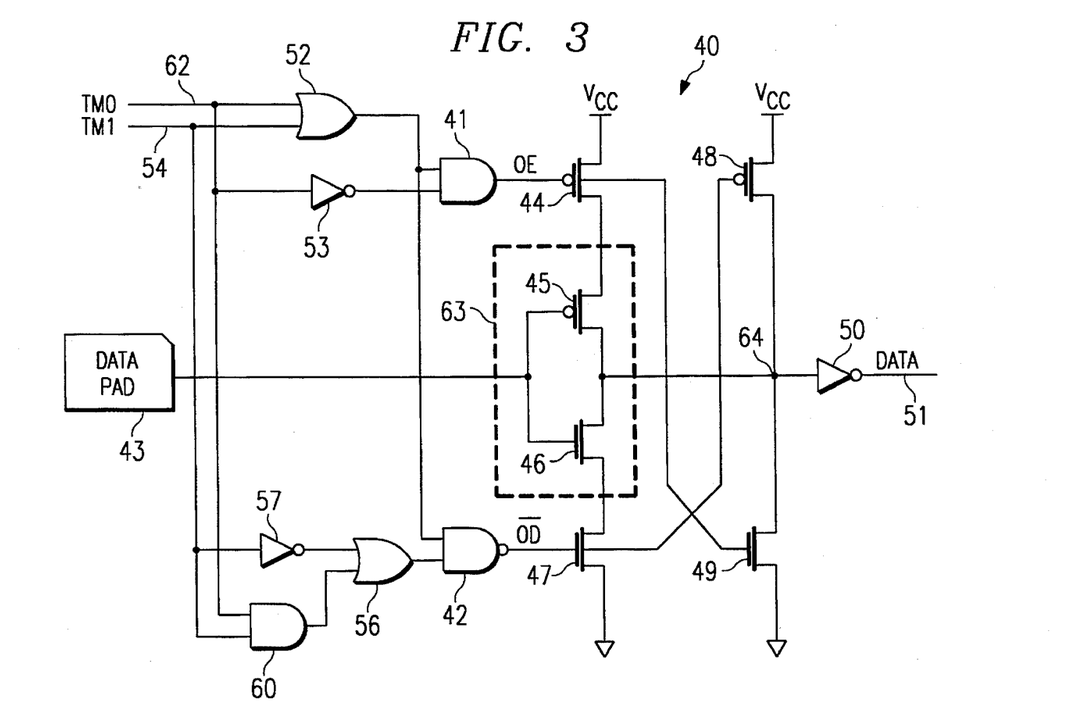
FIG. 3 is an electrical diagram, in schematic form, of a data buffer according to the preferred embodiment of the invention.

FIG. 3 is an electrical diagram illustrating a circuit 40 for a data buffer according to the present invention. A first inverter 63, composed of an n-channel transistor 46 and a p-channel transistor 45 with common gates and a second inverter 50 are connected in series between a data pad 43 and an output signal line 51, labeled DATA. The source terminal of transistor 45 is connected to a pull-up p-channel transistor 44 which is driven by a signal, labeled OE, exiting from the output of a first AND gate 41. The source terminal of transistor 46 is connected to a pull-down n-channel transistor 47 which is driven by a signal, labeled OD bar, exiting from the output of a NAND gate 42. A first input of the first AND gate 41, connected together with a first input of the NAND gate 42, receive an output signal from a first OR gate 52, whose inputs are connected to the input lines 62 and 54 on which are present the two "Test mode" input signals TM0 and TM1 . A second input of the first AND gate 41 is connected, by means of a third inverting gate 53, to the input line 62 on which is present the input signal TM0. A second input of the NAND gate 42 is connected to the output of a second OR gate 56, whose first input is connected, by means of a fourth inverter gate 57, to the input line 54 on which is present the input signal TM1. A second input of the second OR gate 56 is connected to the output of a second AND gate 60, whose inputs are connected to the input lines 62 and 54 on which are present the two input signals TM0 and TM1.

The node 64, common to the output of the first inverter 63 and to the input of second inverter 50, is connected to a pull-up p-channel transistor 48, driven by the signal OD bar, and to a pull-down n-channel transistor 49, driven by the signal OE.

As an example of normal operation of the data buffer 40, if both the signals TM0 and TM1 are low, the logic gates 52, 53 and 41 generate a logic signal low on the signal line labeled OE, and the logic gates 56, 57, 60 and 42 generate a logic signal high on the signal line labeled OD bar. This condition causes both the pull-up transistor 44 and the pull-down transistor 47 to be on, so that the signal present on the data pad 43 is inverted by the first inverter 63 and reaches the node 64. The pull-up and pull-down transistors 48 and 49, connected to the node 64, are both off, so the signal present on node 64 is inverted by the second inverter 50 and reaches the output signal line 51, labeled DATA. In this condition of normal operation, a signal corresponding to the input signal present on the data pad 43 is present on the output signal line 51, labeled DATA.

For a first example of a test mode operation of the data buffer 40, if the signal TM0 is low and the signal TM1 is high, the logic gates 52, 53 and 41 generate a logic signal high on the signal line labeled OE, and the logic gates 56, 57, 60 and 42 generate a logic signal high on the signal line labeled OD bar. This condition causes the pull-up transistor 44 to be off and the pull-down transistor 47 to be on. In this condition the inverter 63 does not work as an inverter and its output, on node 64, is forced low by the pull-down transistor 49 which is turned on by the signal OE. The pull-up transistor 48, connected to the node 64 and driven by the signal OD bar is off. The logic low signal present on node 64 becomes, by means of the second inverter 50, a logic high signal on the output signal line 51, labeled DATA. In this first test mode condition is present a logic signal high on the output signal line 51, labeled DATA. Since all rows and columns are selected in this first test mode, as described above, a "one" data state is written into all memory cells currently selected by address decoders in this first test mode.

As noted above, the second test mode operation of the data buffer 40 is selected by the signal TM0 high and the signal TM1 low. In this condition the logic gates 52, 53 and 41 generate a logic signal low on the signal line labeled OE, and the logic gates 56, 57, 60 and 42 generate a logic signal low on the signal line labeled OD bar. This condition causes the pull-up transistor 44 to be on and the pull-down transistor 47 to be off. In this condition the inverter 63 does not work as an inverter and its output, on node 64, is forced high by the pull-up transistor 48 which is turned on by the signal OD bar. The pull-down transistor 49, connected to the node 64 and driven by the signal OE, is off. The logic high signal present on node 64 becomes, by means of the second inverter 50, a logic low signal on the output signal line 51, labeled DATA. In this second test mode condition, thus, on the output signal line 51, labeled DATA, is present a logic signal low. Since all rows and columns are selected in this second test mode, a "zero" is written into all memory cells currently selected by address decoders.

The third test mode operation of the data buffer 40 is selected by both signals TM0 and TM1 high. In this condition the logic gates 52, 53 and 41 generate a logic signal low on the signal line labeled OE, and the logic gates 56, 57, 60 and 42 generate a logic signal low on the signal line labeled OD bar. The data buffer is in a condition equivalent to the second test mode operation and the output signal line 51, labeled DATA, is forced to a low level. Therefore in this third test operation mode all rows and columns are deselected by address decoders precluding data from being written into any memory cells and the buffer is maintained in a defined state.

Figure 4:
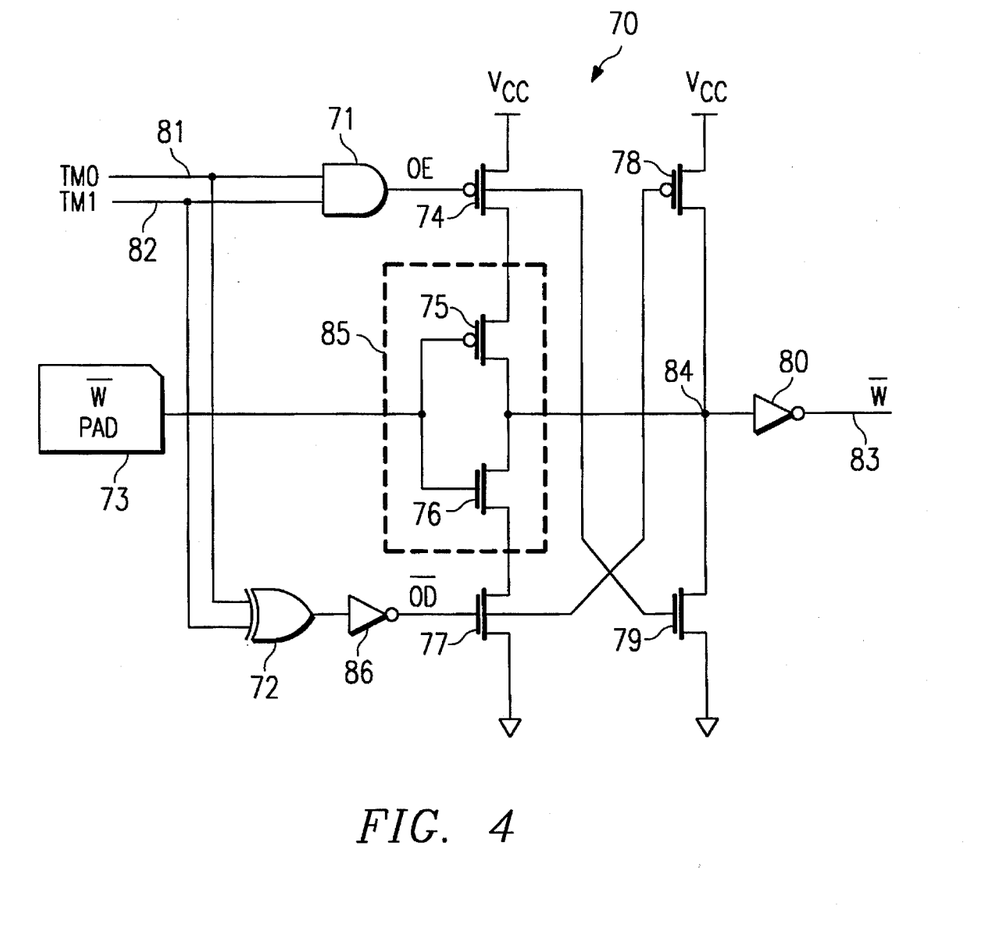
FIG. 4 is an electrical diagram, in schematic form, of a signal buffer according to the preferred embodiment of the invention.

FIG. 4 is an electrical diagram illustrating a circuit 70 for a signal buffer according to the present invention. This signal buffer is used, according to the present invention, to buffer signals W bar and CE bar used respectively to enable write cycles and to enable chip operation, as these two signals are both active low and require the same kind of buffer. Therefore, while in FIG. 4 the input pad and the output signal line are labeled "W bar", the same circuit can be used for the Chip Enable signal "CE bar".

The signal buffer circuit 70 has a first inverter 85, composed of an n-channel transistor 76 and a p-channel transistor 75 with common gates, and a second inverter 80 connected in series between an input pad 73 and an output signal line 83, labeled W bar. The source terminal of transistor 75 is connected to a pull-up p-channel transistor 74 which is driven by a signal, labeled OE, exiting from the output of an AND gate 71. The source terminal of transistor 76 is connected to a pull-down n-channel transistor 77 which is driven by a signal, labeled OD bar, exiting from the output of a third inverting gate 86, whose input is connected to the output of an EXOR gate 72. The two inputs of the AND gate 71, connected together with the two inputs of the EXOR gate 72, receive the two test mode input signals TM0 and TM1 on the input lines 81 and 82. The node 84, common to the output of the first inverter 85 and to the input of second inverter 80, is connected to a pull-up p-channel transistor 78, is driven by the signal OD bar, and is connected to a pull-down n-channel transistor 79, driven by the signal OE.

As an example of normal operation of the signal buffer 70 of FIG. 4, if both the signals TM0 and TM1 are low, the AND gate 71 generates a logic signal low on the signal line labeled OE, and the EXOR gate 72 generates a logic signal low on its output which, inverted by the third inverter 86, becomes a logic signal high on the signal line labeled OD bar. This condition causes both the pull-up transistor 74 and the pull-down transistor 77 to be on, so that the signal present on the signal pad 73 is inverted by the first inverter 85 and reaches the node 84. The pull-up and pull-down transistors 78 and 79, connected to the node 84, are both off, so the signal present on node 84 is inverted by the second inverter 80 and reaches the output signal line 83, labeled W bar. In this condition of normal operation, thus, a signal corresponding to the input signal present on the signal pad 73 is present on the output signal line 83, labeled W bar.

For a first example of a test mode operation of the signal buffer 70, if the signal TM0 is low and the signal TM1 is high, the AND gate 71 generates a logic signal low on the signal line labeled OE, and the EXOR gate 72 generates a logic signal high on its output which, inverted by the third inverter 86, becomes a logic signal low on the signal line labeled OD bar. This condition causes the pull-up transistor 74 to be on and the pull-down transistor 77 to be off. In this condition the inverter 85 does not work as an inverter and its output, on node 84, is forced high by the pull-up transistor 78 which is turned on by the signal OD bar. The pull-down transistor 79, connected to the node 84 and driven by the signal OE, is off. The logic high signal present on node 84 becomes, by means of the second inverter 80, a logic low signal on the output signal line 83, labeled W bar. In this first test mode condition, thus, a logic signal low is present on the output signal line 83, labeled W bar. Since all rows and columns are selected in this mode, and since data buffer 40 is driving a logic "one" state, a "one" data state is written into all memory cells selected by address decoders in this first test mode.

The second test mode operation of the data buffer 40 is selected by the signal TM0 high and the signal TM1 low. In this condition the AND gate 71 generates a logic signal low on the signal line labeled OE, and the EXOR gate 72 generates a logic signal low on the signal line labeled OD bar. The signal buffer is in a condition equivalent to the first test mode operation and the output signal line 83, labeled W bar, is forced to a low level. This means that memory is enabled to start a "write cycle". In this test mode, as described, all rows and columns are selected, and data buffer 40 is driving a "zero" level, to write a "zero" into all cells simultaneously.

The third test mode operation of the signal buffer 40 is selected by both signals TM0 and TM1 high. In this condition the AND gate 71 generates a logic signal high on the signal line labeled OE, and the EXOR gate 72 generates a logic signal high on the signal line labeled OD bar. This condition causes the pull-up transistor 74 to be off and the pull-down transistor 77 to be on. In this condition the inverter 85 does not work as an inverter and its output, on node 84, is forced low by the pull-down transistor 79, which is turned on by the signal OE. The pull-up transistor 78, connected to the node 84 and driven by the signal OD bar, is off. The logic low signal present on node 84 becomes, by means of the second inverter 80, a logic high signal on the output signal line 83, labeled W bar. In this third test mode condition, thus, on the output signal line 83, labeled W bar, is present a logic signal high that disables writing in all memory array.

Figure 5:
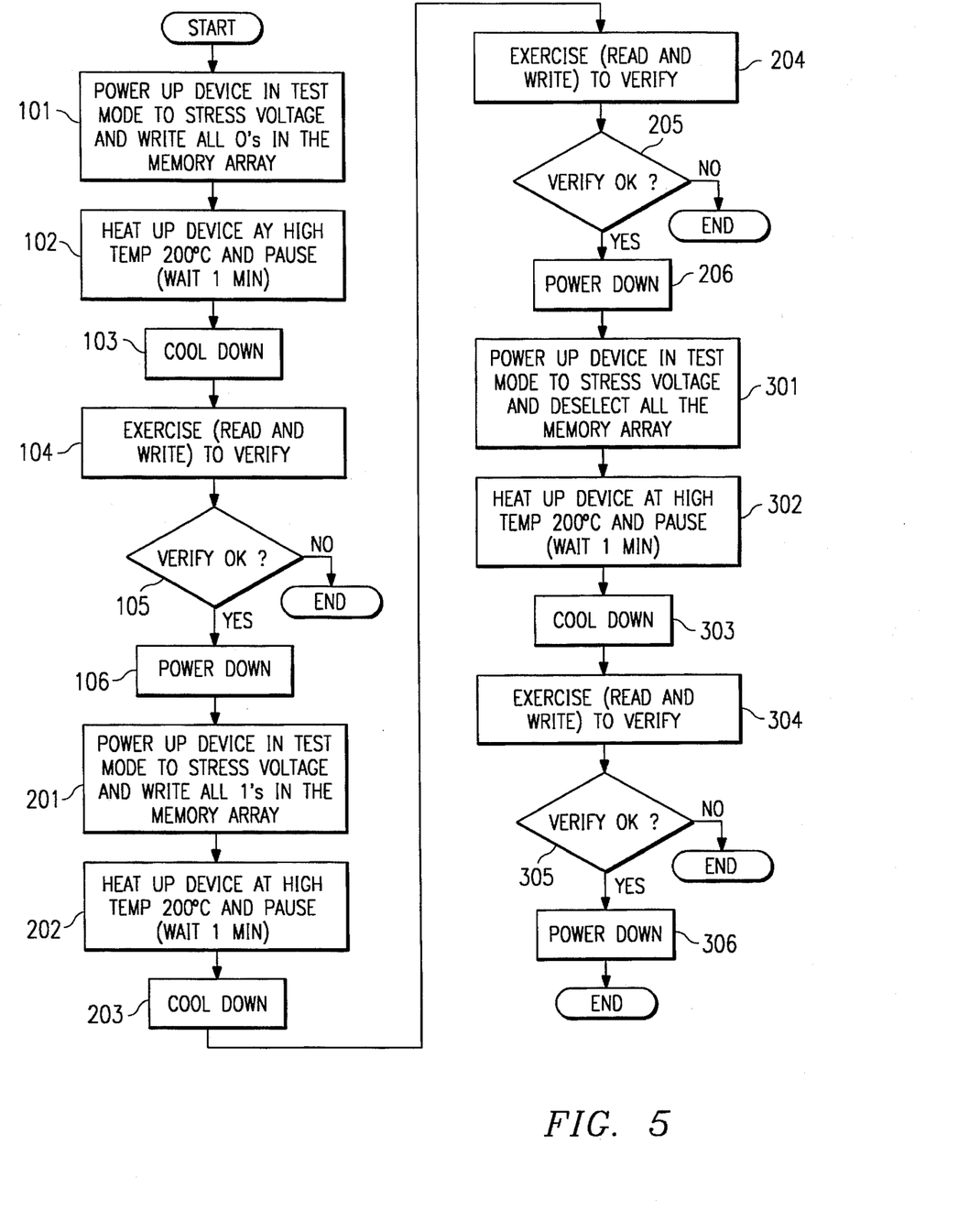
FIG. 5 is a flow chart of a test method according to the present invention.

A method for stress testing an integrated memory circuit that incorporates the above described buffer circuits will now be described. FIG. 5 shows a flow chart of such test method. According to the preferred embodiment of the invention, one stress test cycle consists of three test phases, each test phase defined by the combination of test mode control signals TM0 and TM1 and corresponding to one test operation mode explained above and shown in the following table:

| TM0 | TM1 | Status |
|---|---|---|
| 0 | 1 | First Test Mode (Write all 0's in memory) |
| 1 | 0 | Second Test Mode (Write all 1's in memory) |
| 1 | 1 | Third Test Mode (deselect all memory array) |

The first phase of the test starts by powering up the integrated memory circuit to a stress voltage, e.g. 7 Volt, which is higher than the normal operation voltage of the device. This power up is done while the first test mode control signal TM0 is maintained low and the second test mode control signal TM1 is maintained high. As has been explained above, this combination of test mode control signals forces all outputs of address buffers high to select of all rows and columns in the array of memory cells, forces all outputs of data buffers low, and forces outputs of the two signal buffers for signals "write enable" and "chip enable" low. This situation causes a parallel writing of all memory cells in the array with logic "zeroes". This operation does not require, as in conventional devices, separate control of all address, data and control pads, but only requires control of two signals, TM0 and TM1. This means an effective reduction of test time and of complexity of test probes and test equipment. During this first step, is shown in FIG. 5 as process 101, the bitline loads are disabled.

The next step, shown by process 102, is to heat up the integrated memory circuit to a high temperature, e.g. 200°–250° C. and to pause for a certain amount of time, seconds up to several minutes. The stress condition, maintained on the memory array during process 102, allows test for ionic contamination or charge trap sites. This is allowed by the greater mobility of ions at high temperatures and their tendency to drift (or be attracted) based on an electric field.

Then, in process 103, the device is cooled down and, in process 104, exited test mode, is exercised by writing and reading each memory cell individually, or by bytes or words, to identify any and all failures in the memory array. If this verify step of process 105 fails, the device is discarded (or indicated as a failure when in wafer form) and the stress test ends. If, otherwise, the verify step is passed, the device is powered down in process 106, ending the first phase of the stress test.

The second phase of the stress test starts by again powering up the integrated memory circuit to the same stress voltage while the first test mode control signal TM0 is maintained high and the second test mode control signal TM1 is maintained low. As has been explained above, this combination of test mode control signals forces all outputs of address buffers high to select all rows and columns in the array of memory cells, forces all outputs of data buffers high, and forces outputs of the two signal buffers for signals "write enable" and "chip enable" low. This situation causes a parallel writing of all memory cells in the array with logic "ones". This operation, as in first stress test phase, does not require controlling all address, data and control pads, but requires control of only the two test mode signals TM0 and TM1. During this first step, is shown in FIG. 5 as process 201, the bitline loads are disabled.

The next step, shown as process 202, is to heat up the integrated memory circuit to a high temperature, e.g. 200°–250° C. and to pause for a certain amount of time, seconds up to several minutes. The stress condition, maintained on the memory array during process 202, allows test for ionic contamination or charge trap sites. This is allowed by the greater mobility of ions at high temperatures and their tendency to drift (or be attracted) based on an electric field.

Then, in process 203, the device is cooled down and, in process 204, exited test mode, is exercised by writing and reading each memory cell individually, or by bytes or words, to determining if any of the memory cells in the array are now failures. If this verify step of process 205 fails, the device is identified as a failure and the stress test ends. If, otherwise, the verify step is passed, the device is powered down in step 206 ending the second phase of the stress test.

The third and last phase of the stress test starts by again powering up the integrated memory circuit to the same stress voltage, while the first and the second test mode control signals TM0 and TM1 are maintained high. As explained above, this combination of test mode control signals forces all outputs of address buffers low to deselect of all rows and columns in the array of memory cells, forces all outputs of data buffers low, and forces outputs of the two signal buffers for signals "write enable" and "chip enable" high. In this situation all rows and columns are deselected, writing is disabled, and the "high" chip enable signal causes the disabling of most circuits inside the integrated memory circuit. This operation, as well as in other stress test phases, does not require controlling of all address, data and control pads, but of only the two test mode signals TM0 and TM1. This first step is shown in FIG. 5 as process 301.

Next step, shown as process 302, is to heat up the integrated memory circuit to a high temperature, i.e. 200°–250° C. and to pause for a certain amount of time, seconds up to several minutes. The stress condition, maintained on the memory array during process 302, allows test for ionic contamination or charge trap sites. This is allowed by the greater mobility of ions at high temperatures and their tendency to drift (or be attracted) based on an electric field.

Then, in process 303, the device is cooled down and, in process 304, exited test mode, is exercised by writing and reading each memory cell individually, or by bytes or words, to determine if any portion of the memory is now inoperable. If this verify step of process 305, fails the device is identified as a failure and the stress test ends. If, otherwise, the verify step is passed, the device is powered down in process 306, ending the stress test.

In order to enhance oxide stressing, it is possible to perform an additional oxide stress step, after the steps of cooling down the device (processes 103, 203 and 303), and before exiting the test mode and exercising memory cells individually (processes 104, 204 and 304). This step can be performed in all three described phases, or only in one or two of them, performed by cooling the device to a medium temperature, for example 80° C., raising the supply voltage to a higher stress voltage, for example 9 Volts, and maintaining these conditions for a limited time, for example one second. This step is believed to improve the stress of all oxides in the integrated circuit.

The above described method for stress testing integrated memory circuits, together with the above described buffer circuits, provides a method for detecting latent defects within the memory array as well as within decoders and periphery circuits. DC conditions of the test, compared to traditional dynamic testing at elevated temperature, reduce latchup phenomena and allows test for ionic contamination or charge trap sites. This is allowed by the greater mobility of ions at high temperatures and their tendency to drift (or be attracted) based on a constant electric field.

Furthermore, the stress test described above saves time because it performs, at wafer level, a complete stress test that would otherwise be done in a burn in of packaged devices. All of the stress test can be performed in less than several minutes, or even few seconds, instead of the several hours (such as 96 hours for a 1 Megabyte SRAM) necessary for a conventional burn in test. Finally, the test equipment is also simplified because, during the test, the integrated memory device is controlled by only four pads, two for power supply and two for controlling different test operation modes. This extremely reduced number of pads for each die, controlled during the test, allows, with ordinary test stations, exercising multiple die in parallel without affecting complexity of test equipment or duration of test.

Although the method has been described by applying the three phases in such order, writing all zeroes in the memory array, writing all ones in the memory array and then deselect all memory array, other combination or subsets of the three test phases may be used. For example the sequencing of the test phase may be altered as follows, first deselect all memory array and then write into the memory array all zeroes and then all ones or skip the phase of deselecting all memory array.

In addition, the stress time, the stress voltage applied to the integrated circuit and the temperature are related parameters, and they can vary between certain limits. For example longer time at higher voltage may allow reduced temperature or higher voltage at higher temperature may allow reduced time.

Finally, the verification processes may all be done at the end of all three test phases, so that these three phases can be done on the same simple test station. Indeed the verification process has to be done on a different tester station that permits to read and write single cells, or bytes or words, in the memory array, controlling any address and data signals in normal operation mode.

In other words the method described above may be changed to meet the needs of the user.

While the invention has been particularly shown and described with reference to a preferred embodiment, it will be understood by those skilled in the art that various changes in form and detail may be made therein without departing from the spirit and scope of the invention.

I claim:

1. A signal buffer in an integrated memory circuit, said integrated memory circuit having a normal operation mode and at least two special test operation modes, comprising:
   an input signal line for receiving an input signal;
   a first and a second test mode control input for receiving a mode select code;
   a first output signal line;
   a circuit for generating an output signal on the first output signal line corresponding to the input signal responsive to the first and second test mode control inputs receiving a mode select code indicating normal operation of the integrated circuit, and for generating an output signal on the first output signal line to a predetermined logic state responsive to said first and second test mode control inputs receiving a mode select code indicating one of the at least two special test operation modes.

2. The buffer of claim 1 wherein said circuit generates on the first output signal line a logic signal high responsive to said first and second test mode control inputs receiving a mode select code indicating a first special test operation mode, and a logic signal low responsive to said first and second test mode control inputs receiving a mode select code indicating a second or a third special test operation modes.

3. The buffer of claim 2 wherein the input signal line is a data signal line and the input signal is a data signal.

4. The buffer of claim 1 wherein said circuit generates on the first output signal line a logic signal low responsive to said first and second test mode control inputs receiving a mode select code indicating a first or a second special test operation modes, and a logic signal high responsive to said first and second test mode control inputs receiving a mode select code indicating a third special test operation mode.

5. The buffer of claim 4 wherein the input signal line is a control signal line and the input signal is a control signal.

6. The buffer of claim 1 further comprising:
   a second output signal line;
   wherein said circuit generates an output signal on the second output signal line complementary to the input signal responsive to the first and second test mode control inputs receiving a mode select code indicating normal operation of the integrated circuit, and generates an output signal on the second output signal line corresponding to the output signal on the first output signal line responsive to said first and second test mode control inputs receiving a mode select code indicating one of the at least two special test operation modes.

7. The buffer of claim 6 wherein said circuit generates on both the first and the second output signal lines a logic signal high responsive to said first and second test mode control inputs receiving a mode select code indicating a first or a second special test operation modes, and a logic signal low responsive to said first and second test mode control inputs receiving a mode select code indicating a third special test operation mode.

8. The buffer of claim 7 wherein the input signal line is an address signal line and the input signal is an address signal.

9. A signal bus buffer in an integrated memory circuit, said integrated memory circuit having a normal operation mode and at least two special test operation modes, comprising:
   a multiplicity of input signal lines for receiving a multiplicity of input signals;
   a first and a second test mode control input;
   a first series of output signal lines;
   a multiplicity of circuits for generating a multiplicity of output signals on the first series of output signal lines corresponding to the multiplicity of input signals responsive to the first and second test mode control inputs receiving a mode select code indicating normal operation of the integrated circuit, and for generating an output signal on the first series of output signal lines to a predetermined logic state responsive to said first and second test mode control inputs receiving a mode select code indicating one of the at least two special test operation modes.

10. The bus buffer of claim 9 wherein said multiplicity of circuits generates on the first series of output signal lines a multiplicity of logic signals high responsive to said first and second test mode control inputs receiving a mode select code indicating a first special test operation mode, and a multiplicity of logic signals low responsive to said first and second test mode control inputs receiving a mode select code indicating a second or a third special test operation modes.

11. The bus buffer of claim 10 wherein the multiplicity of input signal lines is a multiplicity of data signal lines and the multiplicity of input signals is a multiplicity of data signals.

12. The bus buffer of claim 9 further comprising:
   a second series of output signal lines;
   wherein said multiplicity of circuits generates a multiplicity of output signals on the second series of output signal lines complementary to the multiplicity of input signals responsive to the first and second test mode control inputs receiving a mode select code indicating normal operation of the integrated circuit, and generates a multiplicity of output signals on the second series of output signal lines corresponding to the multiplicity of output signals on the first series of output signal lines responsive to said first and second test mode control inputs receiving a mode select code indicating one of the at least two special test operation modes.

13. The bus buffer of claim 12 wherein said multiplicity of circuits generates on both the first and the second series of output signal lines a logic signal high responsive to said first and second test mode control inputs receiving a mode select code indicating a first or a second special test operation modes, and a logic signal low responsive to said first and second test mode control inputs receiving a mode select code indicating a third special test operation mode.

14. The bus buffer of claim 13 wherein the multiplicity of input signal lines is a multiplicity of address signal lines and the multiplicity of input signals is a multiplicity of address signals.

15. A method for stress testing an integrated memory circuit having an array of memory cells, comprising the steps of:

applying a first predetermined stress voltage to a plurality of memory cells of the integrated memory circuit in a test mode;

maintaining the integrated memory circuit at a first predetermined temperature for a predetermined period of time;

exiting the integrated memory circuit from the test mode;

exercising each of the plurality of memory cells with write and read cycles to verify the integrity of each memory cell.

16. The method of claim 15 wherein the step of applying a first predetermined stress voltage to a plurality of memory cells of the integrated memory circuit in a test mode comprises:

placing the integrated memory circuit in a test mode;

applying a first predetermined stress voltage to the integrated memory circuit;

exercising a plurality of memory cells.

17. The method of claim 16 further comprising: the step of heating up the integrated memory circuit after performing the step of exercising a plurality of memory cells; and the step of cooling down the integrated memory circuit prior to performing the step of exiting the integrated memory circuit from the test mode.

18. The method of claim 15 wherein the step of exercising a plurality of memory cells further comprises the step of simultaneously selecting a plurality of rows and columns within the array and write a first logic level into said plurality of memory cells.

19. The method of claim 15 wherein the step of exercising a plurality of memory cells further comprises the step of simultaneously selecting a plurality of rows and columns within the array and write a second logic level into said plurality of memory cells.

20. The method of claim 15 wherein the step of exercising a plurality of memory cells further comprises the step of simultaneously deselecting all rows and columns within the array.

21. The method of claim 15 wherein the integrated memory circuit is powered up in a test mode to a stress voltage.

22. The method of claim 15 further comprising a last step of powering down the integrated memory circuit.

23. The method of claim 15 wherein the first predetermined temperature is a temperature greater than 150° C.

24. The method of claim 15 further comprising the step of maintaining the integrated memory circuit at a second predetermined temperature, lower than the first predetermined temperature, for a predetermined period of time and raising the supply voltage applied to the integrated memory circuit to a second predetermined stress voltage prior to performing the step of exercising each of the plurality of memory cells with write and read cycles to verify the integrity of each memory cell.

25. The method of claim 24 wherein the second predetermined temperature is a temperature of about 80° C. and the second predetermined stress voltage is a voltage of 9 Volts.

26. An integrated memory device having a normal operation mode and at least two special test operation modes, comprising:

row, column and write decoders;

address, data and control signal buffers used to generate control signals for the row, column and write decoders; and a memory array comprised of a plurality of memory cells, wherein said row, column and write decoders are utilized to access said memory array;

wherein said address, data and control signal buffers have a first and a second test mode control input for receiving a mode select code and, during the at least two special test operation modes, generate on their outputs predetermined logic signals responsive to said first and second test mode control inputs receiving a mode select code indicating one of the at least two special test operation modes.

27. The device of claim 26 wherein said address, data and control signal buffers, responsive to said first and second test mode control inputs receiving a mode select code indicating a first special test operation mode, generate on their outputs predetermined logic signals so that all row and column decoders are selected and all cells in the memory array are written with logic ones.

28. The device of claim 26 wherein said address, data and control signal buffers, responsive to said first and second test mode control inputs receiving a mode select code indicating a second special test operation mode, generate on their outputs predetermined logic signals so that all row and column decoders are selected and all cells in the memory array are written with logic zeroes.

29. The device of claim 26 wherein said address, data and control signal buffers, responsive to said first and second test mode control inputs receiving a mode select code indicating a third special test operation mode, generate on their outputs predetermined logic signals so that all row and column decoders are deselected.

30. A buffer circuit for an integrated circuit, comprising:

a first inverter, comprising first and second transistors having conduction paths connected in series between a first node and a second node, and having control electrodes connected to one another and coupled to an input terminal of the integrated circuit;

a first bias transistor, having a conduction path connected between the first node and a first power supply voltage, and having a control electrode;

a second bias transistor, having a conduction path connected between the second node and a second power supply voltage, and having a control electrode;

an output circuit, comprising third and fourth transistors having conduction paths connected in series between the first power supply voltage and the second power supply voltage, and each having a control electrode;

a first logic function having inputs coupled to first and second test mode inputs, and having an output coupled to the control electrode of the first bias transistor and to the control electrode of the fourth transistor;

a second logic function having inputs coupled to first and second test mode inputs, and having an output coupled to the control electrode of the second bias transistor and to the control electrode of the third transistor;

wherein the first and the second test mode inputs receive test mode selection signals for selecting at least a first and a second test mode;

and wherein the first and the second logic functions drive the control electrodes of the first and second bias transistors, respectively, in such a manner that the first and second bias transistors are each conducting in at least one of the first and second test modes and drive the control electrodes of the fourth and third transistors, respectively, in such a manner that the third and fourth transistors are each conducting in at least one of the first and second test modes.

31. The buffer of claim 30 wherein the input terminal of the integrated circuit is a data input terminal.

32. The buffer of claim 30 wherein the input terminal of the integrated circuit is a control input terminal.

33. The buffer of claim 30 wherein the output circuit further comprises a fifth and a sixth transistor having conduction paths connected in series between the first power supply voltage and the second power supply voltage, and each having a control electrode;

and wherein the first and the second logic functions drive the control electrodes of the sixth and fifth transistors, respectively, in such a manner that the fifth and sixth transistors are each conducting in at least one of the first and second test modes.

34. The buffer of claim 33 wherein the input terminal of the integrated circuit is an address input terminal.

\* \* \* \* \*